United States Patent
Yang (10) Patent No.: US 9,207,295 B2
(45) Date of Patent: Dec. 8, 2015

(54) MAGNETIC RESONANCE IMAGING APPARATUS AND CONTROL METHOD THEREOF

(71) Applicant: SAMSUNG ELECTRONICS CO., LTD., Suwon-si (KR)

(72) Inventor: Whoe Sun Yang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 421 days.

(21) Appl. No.: 13/713,964

(22) Filed: Dec. 13, 2012

(65) Prior Publication Data

US 2013/0154647 A1 Jun. 20, 2013

(30) Foreign Application Priority Data

Dec. 14, 2011 (KR) .................. 10-2011-0134740

(51) Int. Cl.
*G01V 3/00* (2006.01)
*G01R 33/28* (2006.01)

(52) U.S. Cl.
CPC ............. *G01R 33/28* (2013.01); *G01R 33/283* (2013.01); *G01R 33/288* (2013.01)

(58) Field of Classification Search
CPC ....................................................... G01R 33/288
USPC .................................................. 324/318, 322
See application file for complete search history.

(56) References Cited

U.S. PATENT DOCUMENTS

| | | | |
|---|---|---|---|
| 5,133,017 A * | 7/1992 | Cain et al. ..................... | 381/71.6 |
| 5,313,945 A * | 5/1994 | Friedlander ................... | 600/410 |
| 5,427,102 A * | 6/1995 | Shimode et al. .............. | 600/410 |
| 7,602,189 B2 * | 10/2009 | Decke et al. .................. | 324/318 |
| 8,425,399 B2 * | 4/2013 | Cho et al. ...................... | 600/27 |

* cited by examiner

*Primary Examiner* — Louis Arana
(74) *Attorney, Agent, or Firm* — Sughrue Mion, PLLC (57) ABSTRACT

An MRI apparatus provided with a support panel on which a subject is placed, the MRI apparatus including a noise cancelling unit movably installed at the support panel in a longitudinal direction of the support panel and configured to output a sound wave to cancel noise that reaches a target position, and a controller configured to control the noise cancelling unit to be moved to a target position and output the sound wave to cancel the noise.

16 Claims, 7 Drawing Sheets

MAGNETIC RESONANCE IMAGING APPARATUS AND CONTROL METHOD THEREOF

CROSS-REFERENCE TO RELATED APPLICATION

This application claims priority from Korean Patent Application No. 10-2011-0134740, filed on Dec. 14, 2011, in the Korean Intellectual Property Office, the disclosure of which is incorporated herein by reference in its entirety.

BACKGROUND

1. Field

Apparatuses and methods consistent with exemplary embodiments relate to a magnetic resonance imaging (MRI) apparatuses and methods configured to generate an MR image by detecting a nuclear magnetic resonance (NMR) signal from a subject, and a control method thereof.

2. Description of the Related Art

An MRI apparatus generates a medical image of a subject by using a magnetic field. However, a great amount of noise is generated while magnetic field gradients are being formed, during an MRI imaging of the subject. Methods of cancelling the noise include a manual noise cancelling method and an active noise cancelling method. The manual noise cancelling method uses insulation and absorption, as for example, covering the ears of an imaged subject with a cup or a can. The active noise cancelling method includes a feedback technology and a feed-forward technology. However, with respect to the MRI apparatus, in the related art, the feedback technology is used together with the manual noise cancelling method.

For example, the noise cancelling method of the related MRI apparatus uses a can that covers the ears of a subject, and by detecting the noise inside the can, the noise is cancelled by creating a null in the inside chamber of the can. However, when imaging a patient's head, a head coil is mounted on the patient's head, and the can needs to have a double structure. Moreover, sometimes the can cannot be used due to the size of the patient's head, and the noise reaching the subject is not being cancelled.

Further, in the related art active noise cancelling method, the sound wave configured to cancel the noise is output without considering the position of the head of the subject, i.e., the positions of the ears of the subject. Accordingly, the noise being reached at the subject may not be effectively cancelled. Another related art method provides an additional headset composed of a microphone and a speaker to be mounted on the head for noise cancellation. Such methodology is cumbersome and inconvenient for the patient.

SUMMARY

Exemplary embodiments may address at least the above problems and/or disadvantages and other disadvantages not described above. Also, exemplary embodiments are not required to overcome the disadvantages described above, and an exemplary embodiment may not overcome any of the problems described above.

According to one or more of exemplary embodiments, an MRI apparatus is provided with a noise cancelling unit movably installed at a support panel on which a subject is placed, and configured to move the noise cancelling unit according to a target position that is input by an administrator.

In accordance with an aspect of an exemplary embodiment, there is provided an MRI apparatus provided with a support panel on which a subject is placed, the MRI apparatus including a noise cancelling unit and a controller. The noise cancelling unit may be movably installed at the support panel in a longitudinal direction of the support panel to output a sound wave to cancel noise that is generated from outside and reaches a target position. The controller may be configured to control such that the noise cancelling unit is moved to a target position and outputs the sound wave to cancel the noise.

The noise cancelling unit may be configured to receive pulse sequence information that drives a gradient coil, and to output the sound wave that cancels the noise based on the pulse sequence information.

The noise cancelling unit may be configured to store pulse sequence information, which drives the gradient coil, in advance.

The noise cancelling unit may be configured to output the sound wave that cancels the noise based on characteristic of the reduction of the noise, which is generated from an outside and reaches the target position.

The noise cancelling unit may be configured to detect a frequency, amplitude, and a phase of the noise, and to output the sound wave that cancels the noise based on an analysis result of the noise of the detection.

The noise cancelling unit, in a case when the noise being reached at the target position is in a non-audible frequency band, is configured not to detect the noise as noise.

The noise cancelling unit may be configured to output the sound wave that cancels the noise by being provided with a piezo-electric device that is not affected by a magnetic field.

The noise cancelling unit may be connected to the controller by a wireless network, and is remote-controlled according to a control command of the controller.

In accordance with an aspect of an exemplary embodiment, there is provided a method of controlling an MRI apparatus having a support panel on which a subject is placed. A noise cancelling unit, which is movably installed at the support panel in a lengthwise direction of the support panel, may be moved to a target position. The noise cancelling unit may output a sound wave that cancels a noise being reached at a target position.

The outputting of the sound wave may include outputting the sound wave that cancels the noise based on pulse sequence information that drives a gradient coil.

The outputting of the sound wave may include outputting the sound wave that cancels the noise based on characteristic of the reduction of the noise, which is generated from an outside and reaches the target position.

The method may further include, at the noise cancelling unit, detecting the noise, which is generated from an outside and reaches the target position.

The outputting of the sound wave may include outputting the sound wave, which cancels the noise, according to an analysis result of a frequency, amplitude, and a phase of the detected noise.

The detecting of the noise includes detecting, in a case when the noise being reached at the target position is in a non-audible frequency band, the detected noise as non-noise.

The method may further include moving the noise cancelling unit to an original position, which is a designated in advance, when the MR imaging of the subject is completed.

In accordance with an aspect of an exemplary embodiment, by using a noise cancelling unit installed at a support panel on which a subject is placed, the noise generated in the imaging region may be actively cancelled without using a can covering the ears of a subject.

For example, by considering the position of the head of a subject, in detail, the positions of the ears of the subject, the noise cancelling unit may be moved according to an input of an administrator, and thus the noise being reached at the subject may be effectively cancelled.

BRIEF DESCRIPTION OF THE DRAWINGS

The above and/or other aspects will become more apparent by describing certain exemplary embodiments, with reference to the accompanying drawings in which.

DETAILED DESCRIPTION

Certain exemplary embodiments are described in greater detail below with reference to the accompanying drawings.

In the following description, like drawing reference numerals are used for the like elements, even in different drawings. The matters defined in the description, such as detailed construction and elements, are provided to assist in a comprehensive understanding of exemplary embodiments. However, exemplary embodiments can be carried out without those specifically defined matters. Also, well-known functions or constructions are not described in detail since that would obscure the description with unnecessary detail.

Figure 1:
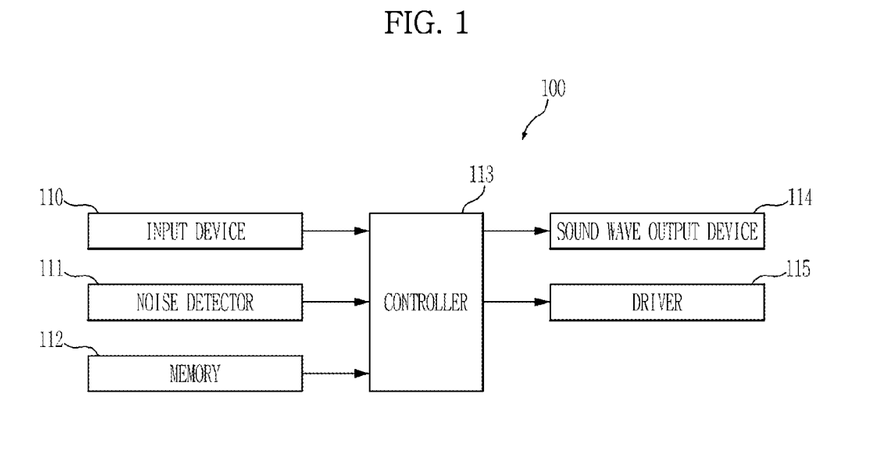
FIG. 1 is a block diagram schematically illustrating a structure of a noise cancelling unit in accordance with an exemplary embodiment.

FIG. 1 is a block diagram schematically illustrating a structure of a noise cancelling unit in accordance with an exemplary embodiment.

Referring to FIG. 1, the noise cancelling unit 100 includes an input device 110 to which various commands and information are input, a noise detector 111 to detect the noise, a memory 112 which stores software programs and data configured to cancel noise, a sound wave output device 114 to output the sound wave that cancels noise, a driver 115 configured to move the body of the noise cancelling unit, and a controller 113 to control the operation of the noise cancelling unit. For example, the power for the operation of the noise cancelling unit may be supplied by a secondary battery installed at the body of the noise cancelling unit.

The input device 110 is connected to a computer system, and transmits the control command that is input from the computer system to the controller 113. The input device 110 is connected by a wired or wireless network to the computer system. For example, the input device 110 is connected to the computer system by a LAN, a Bluetooth, a Zigbee, or an infrared ray (IR) communication, and the computer system may enable the noise cancelling unit to perform a noise cancelling operation by remote-controlling the noise cancelling unit. For example, the input device 110 may include a transceiver.

The computer system inputs positional information, which shows a target position, into the input device 110, to provide the controller 113 with the positional information. The controller 113 controls the driver 115 to move a body of the noise cancelling unit to a target position.

The noise detector 111 detects noise, which is generated at an outside of the body of the noise cancelling unit, and transmits the noise detection result to the controller 113.

The noise detector 111 may include a noise sensor and/or a microphone to detect the noise and/or sound generated outside of the noise cancelling unit body. As one example, the noise detector 111 may convert the sound pressure of the detected noise into the voltage, and may detect the frequency, the amplitude, and the phase of the noise. For example, the noise detector 111 may only detect the noise which reaches the position of the body of the noise cancelling unit.

However, when the detected sound is in a non-audible frequency band that a human cannot perceive as noise, the noise detector 111 is configured to distinguish the non-audible sound from the noise and, thus, a determination is made that the detected sound is not noise.

The memory 112 stores a program configured to cancel noise, and the characteristic of the reduction of noise with respect to the position to which the noise cancelling unit is moved. As the distance from the noise source, which generates noise, is greater, the reduction amount of the noise is increased, and as the distance from the noise source is smaller, the reduction amount of the noise is decreased.

The memory 112 stores a measurement result or measurement results, which are obtained in advance, of the characteristic of the reduction of the noise which could reach the position or the positions to which the noise cancelling unit is moved. The controller 113 may calculate waveform information that cancels the noise, and may use the stored characteristic of the reduction of the noise at a certain position, as a reference.

The sound wave output device 114 is connected to the controller 113, and outputs a sound wave, which cancels the noise, according to the control signal and the waveform information input from the controller 113. For example, the sound wave output from the sound wave output device 114 offsets with the generated noise, and as the sound wave and the noise are offset with respect to each other, the noise is actively canceled. The sound wave output device 114 may include a piezo-electric device. For example, the piezo-electric device is not affected by a magnetic field.

For example, the sound wave output device 114 may output a sound wave by amplifying the sound wave at a predetermined level according to the control signal and the waveform information input from the controller 113. The level of the sound wave may be adjusted to correspond to the sound pressure level of the noise that is detected by the noise detector 111. For example, a speaker function may be additionally applied at the sound wave output device 114, and an administrator of the MRI apparatus may deliver a voice to a subject, by using the sound wave output device 114. The voice sound is thus may be measured and the sound wave may be adjusted or finely tuned.

The driver 115 provides a driving force so that the body of the noise cancelling unit may be moved. For example, the driver 115 may be connected to or may include a motor configured to provide a driving force. The controller 113 may convert the rotational operation of the motor into the linear operation of the body of the noise cancelling unit, and, thus, the body of the noise cancelling unit may be moved.

The controller 113 receives data including the control command, the noise detection result, and the characteristic of the reduction of the noise from the input device 110, the noise detector 111, and the memory 112, respectively. The controller 113 may generate the waveform to cancel the noise that vary according to the type of the noise detected by the noise detector 111, and may transmit the waveform to the sound wave output device 114. As one example, the controller 113 analyzes the frequency, the amplitude, and the phase of the noise detected by the noise detector 111, and according to the analysis result, calculates waveform information that offsets the noise. As illustrated, the controller 113 is provided within the body of the noise cancelling unit, but this is not limiting. For example, the controller 113 may be provided as a component of a computer system, and may be disposed separately from the noise cancelling unit. For example, the computer system may directly control the noise cancelling unit, move the noise cancelling unit to a target position, and control the noise cancelling unit to output the sound wave that cancels the noise.

The noise cancelling unit in accordance with an exemplary embodiment may output a waveform, which cancels the noise, according to pulse sequence information that is input from a computer system. That is, the main noise source in a bore of an MRI apparatus is due to generation of the magnetic field gradients. The noise is generated periodically, and the sound pressure is generated in correspondence to the strength of the magnetic field gradients according to the pulse sequence that drives the gradient coil. For example, the controller 113 may calculate the waveform based on the pulse sequence information that is input from the computer system and may, thus, effectively offset the noise.

For example, the input device 110 is connected to the computer system, and transmits the pulse sequence information from the computer system to the controller 113. The pulse sequence information includes the information on the timing, the strength and the phase of the radio-frequency (RF) pulse that a transmit coil transmits, as well as the information on the timing, the strength, the phase, and the direction of the magnetic field gradients that formed by a gradient coil. The pulse sequence information, which is generated and transmitted from the computer system, may be stored in advance in the memory 112.

The controller 113 receives the data including the control command, the pulse sequence information, the noise detection result, and the characteristic of the reduction of the noise from the input device 110, the noise detector 111, and the memory 112, and transmits the waveform that may cancel the noise to the sound wave output device 114. The sound wave output device 114 is connected to the controller 113, and outputs the sound wave, which cancels the noise, according to the control signal and the waveform information that are input from the controller 113.

Figure 2A:
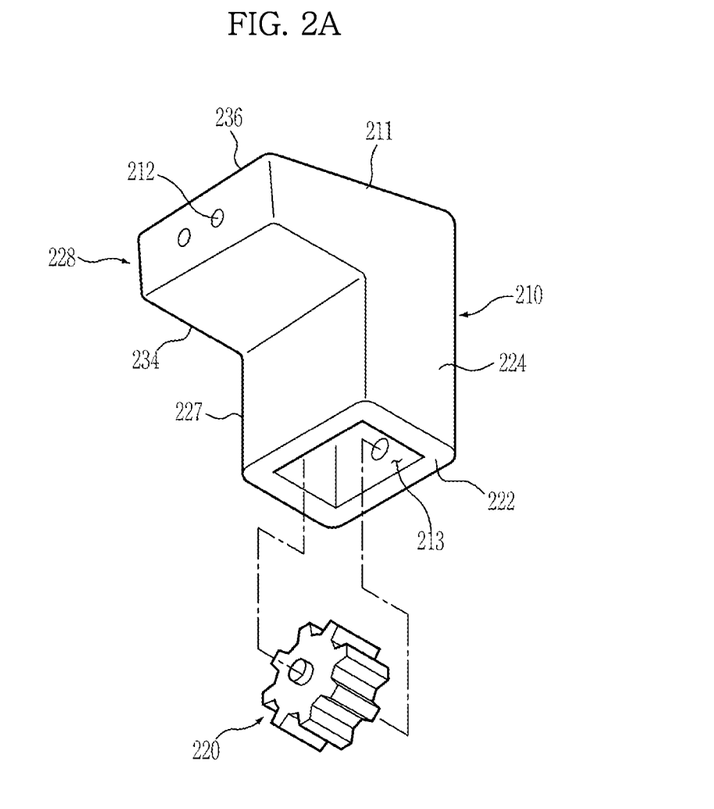
FIGS. 2A, 2B, and 2C are perspective views schematically illustrating a structure of the noise cancelling unit in accordance with an exemplary embodiment.
Figure 2B:
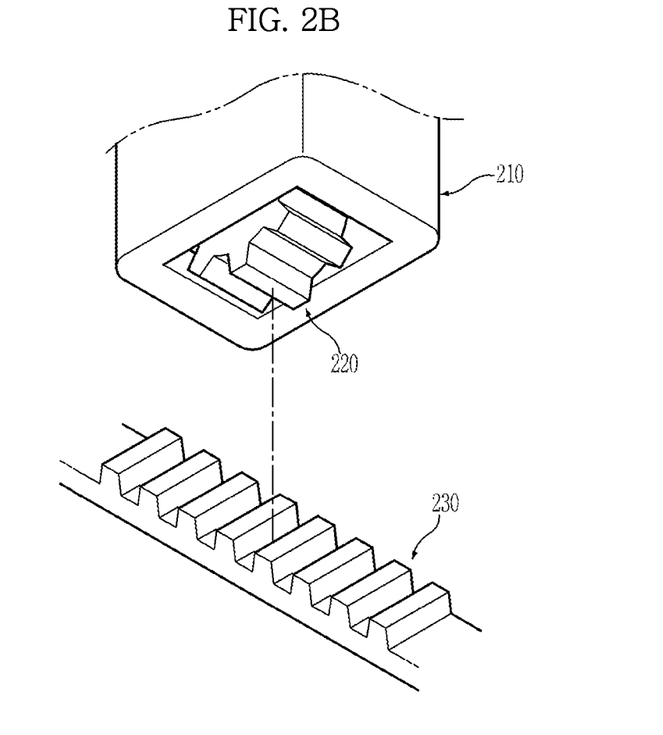
Figure 2C:
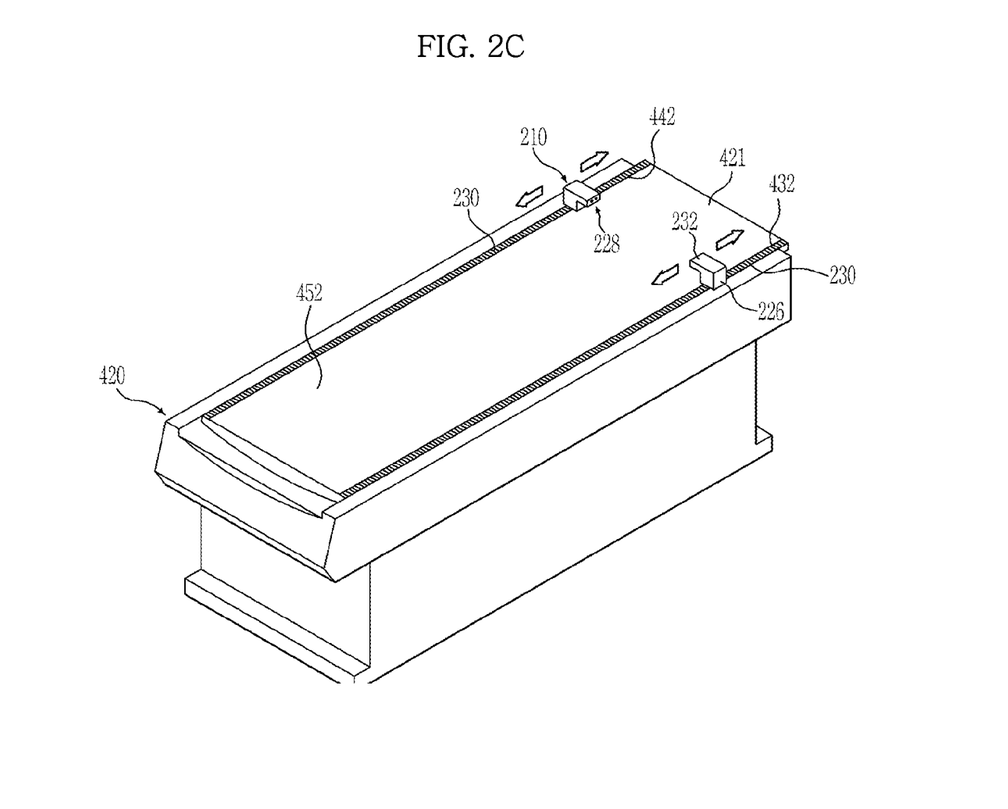

FIGS. 2A, 2B, and 2C are perspective views schematically illustrating a structure of the noise cancelling unit in accordance with an exemplary embodiment.

Referring to FIGS. 2A to 2C, the noise cancelling unit 210 includes a body 211 forming an exterior, and a pinion gear 220 to move the body 211.

The body 211 of the noise cancelling unit 210 includes a lower portion 222 and the two vertical walls 224 which extend substantially perpendicular to one another from the lower portion 222. A front surface 226 and a rear surface 227 extend between the two vertical walls 224 from the lower portion 222. A protruding portion 228 protrudes from the rear surface 227 disposed closer to the subject, toward the position of the subject, i.e., the position of the patient's ears, and includes an upper surface 232 and a lower surface 234. In order for the sound wave output from the noise cancelling unit 210 to reach an outside, a hole or holes 212 through which the sound wave is passed are formed through a side surface 236 of the protruding portion 228 of the body 211.

The pinion gear 220 is installed in an opening 213 formed at a lower portion 222 of the body 211. The pinion gear 220 is rotated as the pinion gear 220 is interlocked with a rack 230 formed on a support panel 421. As the pinion gear 220 is rotated while interlocked with the rack 230, the rotational operation of the pinion gear 220 is converted into the linear operation of the body 211. For example, the body 211 of the noise cancelling unit 210 may be moved in the lengthwise direction of the rack 230. In order to deliver rotational force to the pinion gear 220, a motor is installed at the body 211 as a driver of the body 211. A gear being teeth-engaged with the pinion gear 220 is formed at the rotational axis of the body 211, and as the motor is rotated forward and backward, the moving direction of the body 211 is determined.

A movable table 420 is installed at the MRI apparatus so that a subject may be moved to a bore of a gantry, for imaging. The movable table 420 is provided with the support panel 421 on which the subject is placed, which may be moved in a sliding manner on the table 420. The rack 230 is formed at each side portion 432, 442 of an upper surface 452 of the support panel 421 along the lengthwise direction of the support panel 421. The body 211 of the noise cancelling unit 210 is positioned on each rack 230, and the body 211 is moved along the lengthwise direction of the rack 230.

The noise cancelling unit 210 illustrated in FIGS. 2A to 2C is an example of the noise cancelling unit 210 movably installed at the support panel 421 and including two noise canceling units, but the noise cancelling unit 210 is not limited thereto.

Figure 3:
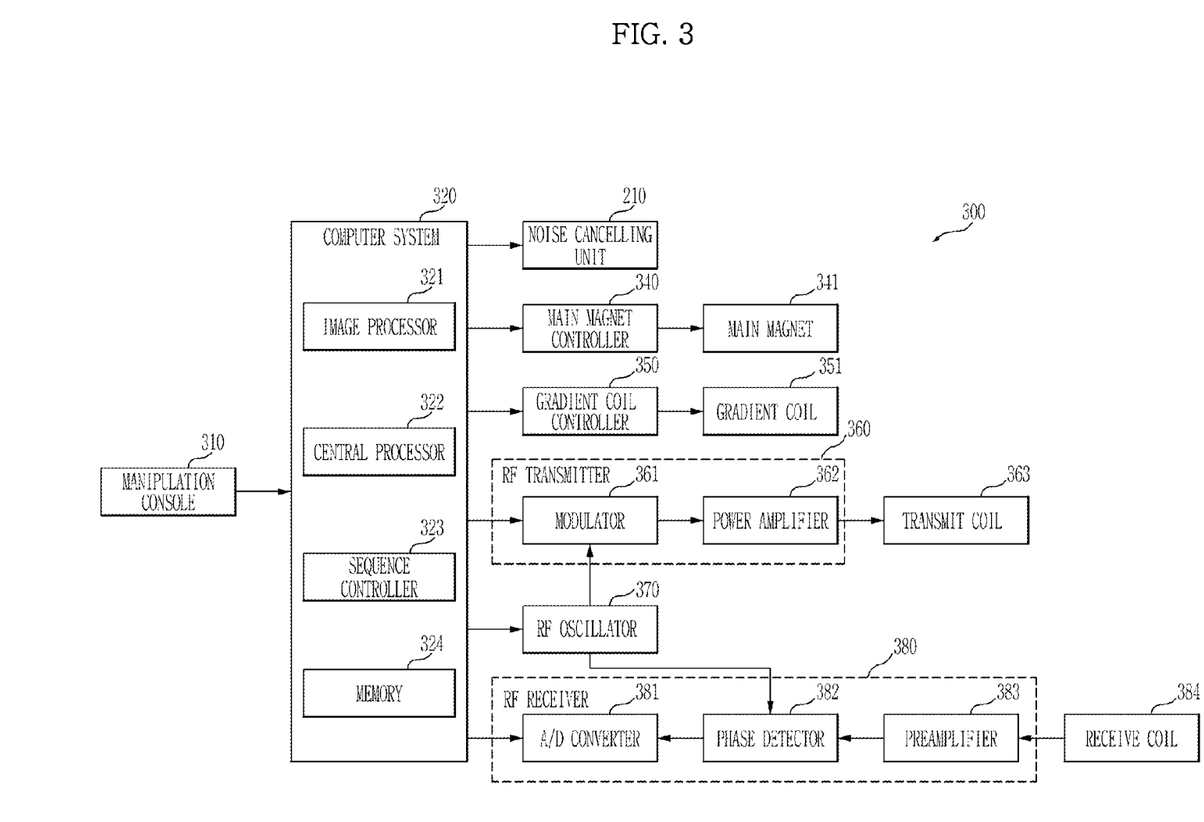
FIG. 3 is a block diagram schematically illustrating a structure of an MRI apparatus in accordance with an exemplary embodiment.

FIG. 3 is a block diagram schematically illustrating a structure of the MRI apparatus in accordance with an exemplary embodiment.

Referring to FIG. 3, the MRI apparatus includes a noise cancelling unit 210 to cancel the noise generated during the MR imaging, a main magnet controller 340 to form a main magnetic field, a gradient coil controller 350 to form magnetic field gradients, an RF transmitter 360 to radiate an RF pulse at a subject, an RF receiver 380 to detect an NMR signal from a subject, an RF oscillator 370 to supply a pulse signal, and a computer system 320 to control the operation of the MRI apparatus. The MRI apparatus includes a bore, i.e., the imaging region, inside a gantry, to image a subject.

The noise cancelling unit 210 is connected to the computer system 320, and outputs a sound wave that cancels noise, according to the control command of the computer system 320. The noise cancelling unit 210 calculates waveform information that offsets the noise, and according to the waveform information, outputs the sound wave which offsets the noise, and, thus, actively cancels the noise. For example, the noise cancelling unit 210 is installed at the side portions 432, 442 of the upper surface 452 of the support panel 421, and according to the control command of the computer system 320, the noise cancelling unit 210 is moved to a target position. As one example, the target position to which the noise cancelling unit 210 is moved may be the position of the head of the subject, such as the position of the ears of the subject. That is, the noise cancelling unit 210 is moved to be disposed close to the patient's ears, at the side portions 432, 442 which extend in the lengthwise direction 460 of the subject 450.

The main magnet controller 340 is connected to the computer system 320, and forms a uniform main magnetic field, according to the control command of the computer system 320, in a parallel direction with the lengthwise direction 460 of the subject positioned for imaging in the bore of the MRI apparatus. The main magnetic field formed in the lengthwise direction 460 is referred to as a horizontal magnetic field. To form a main magnetic field, the main magnet controller 340 drives the main magnet 341, which may include a normal conductive coil or a superconductive coil. The main magnetic field may be formed in the direction that is vertical to the lengthwise direction 460 of a subject, and the magnetic field formed in the vertical direction is referred to as a vertical magnetic field. In the case when a vertical magnetic field is formed, a permanent magnet may be used as the main magnet 341.

The gradient coil controller 350 is connected to the computer system 320, and forms magnetic field gradients inside the bore of the MRI apparatus according to the control command of the computer system 320. To form magnetic field gradients, the gradient coil controller 350 drives the gradient coil 351 which forms magnetic field gradients having three-axis directions that are perpendicular to one another inside the bore of the MRI apparatus, thereby providing gradients to the strength of the main magnetic field. Accordingly, three magnetic field gradients are formed in each of a frequency-axis direction, a phase-axis direction, and an intercept-axis direction, respectively. The magnetic field gradient in the frequency-axis direction is used in frequency-encoding, the magnetic field gradient in the phase-axis direction is used in phase-encoding, and the magnetic field gradient in the intercept-axis direction is used in an intercept-selecting. To form the three-axis direction magnetic field gradients, the gradient coil unit 351 may include three gradient coils.

Assuming that the coordinate axes that are perpendicular to one another inside the bore of the MRI apparatus are an x-axis, a y-axis, and a z-axis, one axis of the three axes may be set as the interception-axis, another axis may be set as the phase-axis, and other axis may be set as the frequency-axis. For example, the frequency-axis, the phase-axis, and the interception-axis, while maintaining a perpendicular position to one another, may be in gradient by a predetermined angle with respect to the x-axis, the y-axis, and the z-axis, respectively. In the MRI of an exemplary embodiment, the lengthwise direction of a subject is set as the x-axis, the depth direction of the subject is set as the y-axis, and the width direction of the subject is set as the z-axis.

The RF transmitter 360 is connected to the computer system 320, and radiates an RF pulse at a subject according to the control command of the computer system 320. The RF transmitter 360 is provided with a modulator 361 and a power amplifier 362, and drives a transmit coil 363 to transmit an RF pulse at a subject. The transmit coil 363, in order to excite a spin at an inside the body of a subject introduced into the inside space of the MRI apparatus, transmits an RF pulse at the subject.

The pulse signal supplied from the RF oscillator 370 is supplied to the modulator 361, which modulates the pulse signal, which is supplied from the RF oscillator 370, into an RF pulse having a predetermined timing and a predetermined phase. The modulated RF pulse is supplied to the power amplifier 362, which amplifies the power of the modulated RF pulse and supplies the amplified RF pulse to the transmit coil 363. The transmit coil 363 transmits the power-amplified RF pulse at a subject.

The RF receiver 380 is connected to the computer system 320, and detects an NMR signal from a subject according to the control command of the computer system 320. The RF receiver 380 is provided with a preamplifier 383, a phase detector 382, and an analog-to-digital (A/D) converter 381, and drives a receive coil 384 to detect the NMR signal from the subject. The receive coil 384 detects the NMR signal that is generated by the excited spin from the subject.

The NMR signal detected by the receive coil 384 is supplied to the preamplifier 383, which amplifies the NMR signal detected by the receive coil 384. The amplified NMR signal is supplied to a phase detector 382, which refers to the pulse signal supplied from the RF oscillator 370 and detects the phase of the NMR signal that is amplified. The NMR signal having the phase detected is supplied to the A/D converter, which converts the NMR signal having the phase detected into a digital signal and supplies the digital signal to the computer system 320.

Depending on the purpose of the imaging or depending on the portion of the subject to be imaged, the transmit coil 363 and/or the receive coil 384 may include a surface coil or a body coil, and may be formed as a single transmit/receive coil unit which distinguishes the transmission function and the reception function, depending on timing of the transmission and reception signals.

The computer system 320 is provided with a central processor 322, an image processor 321 to compose an MR image based on the NMR signal, a sequence controller 323 generating a pulse sequence, and a memory 324 which stores software programs, data, etc.

The sequence controller 323 generates the timing, the strength, and the phase of the RF pulse that the transmit coil 363 transmits, as well as the pulse sequence that shows the timing, the strength, and the phase of the magnetic field gradients formed by the gradient coil 351.

The central processor 322 controls the main magnet controller 340, the gradient coil controller 350, the RF transmitter 360, the RF oscillator 370, and the RF receiver 380 based on the pulse sequence, and transmits the pulse sequence information to the noise cancelling unit 210. For example, the central processor 322 is manipulated by an input of an administrator or a medical professional, and transmits various control commands, which are needed for the detection of an NMR signal, to the main magnet controller 340, the gradient coil controller 350, the RF transmitter 360, the RF receiver 380, and the RF oscillator 370. The central processor 322 moves the noise cancelling unit 210 to a target position according to the input of an administrator, and cancels the noise that may be generated during the MR imaging by transmitting a control command to the noise cancelling unit 210.

The image processor 321, based on the NMR signal detected from a subject, composes an MR image. The NMR signal detected from a subject may be obtained as a sampling signal in the three-dimensional (3D) Fourier space. The three-axis directions of the magnetic field gradients formed by the gradient coil 351 determine the position of the sampling signal in the 3D Fourier space. The image processor 321 performs an inverse Fourier transform on the sampling signal in the Fourier space and generates an MR image.

A data space, at which the NMR signal detected from a subject is stored, is generated in the memory 324, and the data space is configured to correspond to the 3D Fourier space. The memory 324 may store various data such as image processing programs, etc.

The MRI apparatus further includes a manipulation console 310. The manipulation console 310 is provided with a manipulation unit enabling an administrator to manipulate the MRI apparatus, and a display configured to display the state of the MRI apparatus, the generated MR image, patient information, etc. The manipulation console 310 may be connected to the computer system 320 by a network. An administrator, through the manipulation unit, may input various commands and information to the computer system 320. The display, according to the manipulation of an administrator, may display various information and MR image that are transmitted from the computer system 320. For example, the display may display the frequency, the amplitude, the phase information, or the noise elimination status of the waveform that is output by the noise cancelling unit 210.

Figure 4:
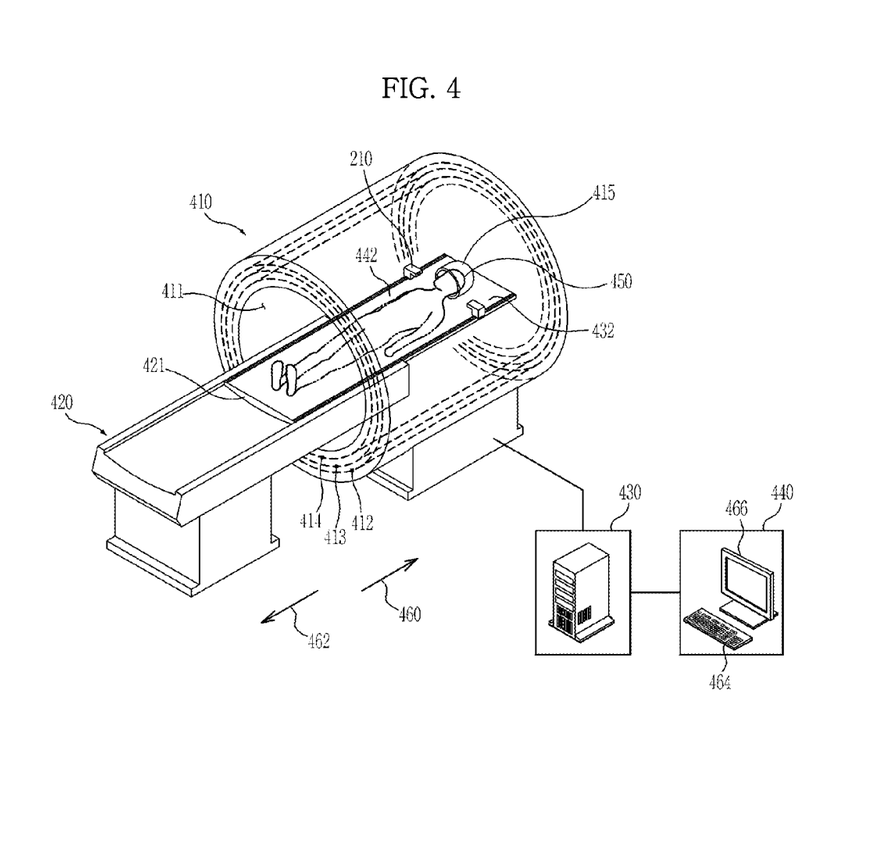
FIG. 4 is a perspective view schematically illustrating a structure of an MRI apparatus in accordance with an exemplary embodiment.

FIG. 4 is a perspective view schematically illustrating a structure of the MRI apparatus in accordance with an exemplary embodiment.

Referring to FIG. 4, a gantry 410 of the MRI apparatus includes an RF coil assembly 414, such as a body coil, configured to radiate an RF pulse and to detect an NMR signal, and a gradient coil 413 for forming magnetic field gradients which are installed in the concentric shape. At an outer side of the gradient coil 413, a main magnet 412 forming a main magnetic field is installed. A bore 411 is formed in the gantry 410, and a subject 450 is move into the bore 411 on the support panel 421, in a sliding manner.

For example, a surface coil 415, i.e., a head coil, having the shape of a cylinder is mounted on the head of the subject 450, for imaging a local portion of the head of the subject 450. While an MR imaging is performed, the noise is generated, when the magnetic field gradients are formed, and may reach the ears of the subject 450. In the related art, the subject 450 is inconveniently provided with an additional noise-canceling headset composed of a microphone and a speaker to be mounted on the head of the subject 450. However, in accordance with an exemplary embodiment, the noise cancelling unit 210 is movably installed at each side portion 432, 442 of the support panel 421. When the support panel 421 is moved into the bore 411 in a sliding manner, the noise cancelling unit 210 may be moved along the lengthwise direction of the support panel 421, i.e., the subject 450. As one example, when the MR imaging is performed on the leg of the subject 450, the head of the subject 450 may be positioned outside the gantry 410, while the noise cancelling unit 210 may be moved in a direction 462 opposite to the lengthwise direction 460.

The MRI apparatus includes the computer system 430 to control the operation during the MR imaging of the subject, and the computer system 430 may be manipulated via the manipulation console 440. An administrator manipulates the MRI apparatus through the manipulation console 440, and according to the position of the head of the subject 450, inputs a target position of the noise cancelling unit 210 to the computer system 430, by using a keyboard 464, a touch screen of a display 466, and the like. The computer system 430 transmits the target position, which is input by the administrator, to the noise cancelling unit 210, and controls the noise cancelling unit 210 to be moved to the target position.

In an exemplary embodiment, a driver configured to move the noise cancelling unit 210 is provided at the body of the noise cancelling unit 210, but the driver that moves the noise cancelling unit 210 may be provided at the support panel 421. In this case, the computer system 430 controls the driver provided at the support panel 210, to move the noise cancelling unit 210 to the target position without transmitting the target position input by the administrator to the noise cancelling unit 210.

For example, the target position at which the noise cancelling unit 210 is moved may be near the position of the head of the subject 450 so that the noise reaching the ears of the subject 450 is effectively cancelled. As another example, in order to effectively cancel the noise generated from a noise source, the noise cancelling unit 210 may be placed near another appropriate position different from the position near the head of the subject 450.

Figure 5:
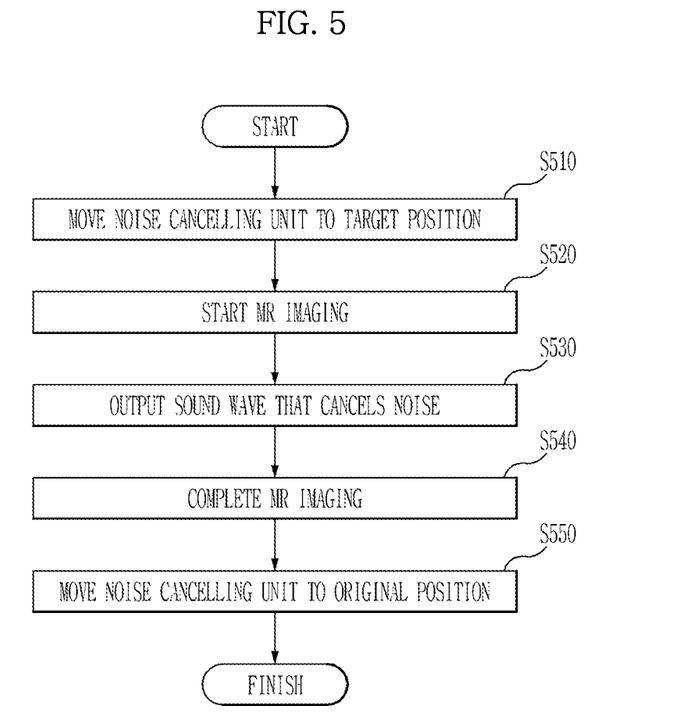
FIG. 5 is a flow chart schematically illustrating a control method of an MRI apparatus in accordance with an exemplary embodiment.

FIG. 5 is a flow chart schematically illustrating a method of controlling an MRI apparatus in accordance with an exemplary embodiment.

In operation S510, the noise cancelling unit is moved to a target position. An administrator inputs the target position of the noise cancelling unit through the manipulation console, and the computer system transmits the target position, which the administrator inputs, to the noise cancelling unit. The noise cancelling unit, by driving the motor, is moved along the lengthwise direction of the support panel to the target position.

As another example, the computer system, according to the pre-stored profile information of the subject, i.e., the dimensions and the geometry of the subject, determines the target position of the noise cancelling unit, and may transmit the target position to the noise cancelling unit. Accordingly, the noise cancelling unit, even without the input by an administrator, automatically drives the motor to be moved to the target position that is transmitted by the computer system. The movement of the noise cancelling unit may be performed before or after the support panel with the subject is moved into the bore.

In operation S520, the MR imaging of the subject is started. An administrator, through the manipulation console, controls the computer system to generate an MR image, and the computer system drives the main magnet, the gradient coil, the transmit coil, and the receive coil. The transmit coil and the receive coil may be configured as a single transmit/receive coil unit. By driving the main magnet, the gradient coil, and the transmit coil, a main magnetic field and magnetic field gradients are formed in the bore, and an RF pulse is transmitted at a subject from the transmit coil. As the RF pulse is radiated, a spin is excited in the body of the subject, and the receive coil detects an NMR signal from the subject. In the MR imaging, noise is generated and may reach the ears of the subject. The main source of the noise is due to the generation of the magnetic field gradients.

As the MR imaging is started, the noise cancelling unit is placed at the target position and detects the noise that reaches the target position. As described above, the noise cancelling unit may detect the frequency, the amplitude, and the phase of the noise, or may detect if the noise reaches the target position. Meanwhile, only the frequency band (the audible frequency band) that a human may perceive as noise may be detected to constitute noise subject to described-above noise cancellation.

In operation S530, the sound wave that cancels the noise is output. When noise is detected at the target position, the noise cancelling unit analyzes the waveform of the noise, and according to the analysis result, outputs the sound wave that offsets the noise and actively cancels the noise that reaches the subject a certain position, i.e., the ears of the patient.

In operation S540, the MR imaging of the subject is completed. The computer system composes an MR image based on the NMR signal that is detected by the receive coil, and completes the MR imaging while displaying various information, such as the MR image, on the display 466 of the manipulation console.

In operation S550, the noise cancellation unit is moved to an original position, from the target position. That is, when the MR imaging of the subject is completed, the noise cancellation unit, according to the input of an administrator, is moved to an original position at which the noise cancelling unit was positioned before moving to the target position.

According to a method of controlling an MRI apparatus in accordance with an exemplary embodiment, the noise cancelling unit may be controlled to output a waveform that cancels the noise according to the pulse sequence information input from the computer system. The main noise source may be the generation of magnetic field gradients formed in the bore of the gantry, and thus, the noise cancelling unit, with respect to calculating the waveform information of the sound wave, may use the pulse sequence information that drives a gradient coil, as a reference.

In this case, the noise cancelling unit, without detecting the noise that reaches the target position, outputs the sound wave that cancels the noise at the same time as the MR imaging is performed or after a certain time period is passed. The noise cancelling unit, with respect to calculating the waveform information of the sound wave that offsets the noise, may use the characteristic of the reduction of the noise that reaches the target position as a reference as well as the pulse sequence information.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A magnetic resonance imaging (MRI) apparatus comprising:
   a support panel on which a subject is placed;
   a noise cancelling unit which is installed at the support panel to be movable in a longitudinal direction of the support panel and configured to output a sound wave that cancels noise that reaches a target position; and
   a controller configured to control the noise cancelling unit to be moved to the target position and to output the sound wave that cancels the noise,
   wherein the noise cancelling unit is configured to receive pulse sequence information that drives a gradient coil, and output the sound wave that cancels the noise based on the pulse sequence information.

2. The MRI apparatus of claim 1, wherein the noise cancelling unit is configured to store the pulse sequence information in advance.

3. The MRI apparatus of claim 2, wherein the noise cancelling unit is configured to output the sound wave that cancels the noise based on characteristic of a reduction of the noise, which is reachable at the target position.

4. The MRI apparatus of claim 1, wherein the noise cancelling unit is configured to detect a frequency, amplitude, and a phase of the noise, and output the sound wave that cancels the noise based on an analysis result of the detected frequency, amplitude, and phase of the noise.

5. The MRI apparatus of claim 4, wherein the noise cancelling unit is further configured to detect a sound in a non-audible frequency band and not to output the sound wave that cancels the noise when the detected sound is in the non-audible frequency band.

6. The MRI apparatus of claim 1, wherein the noise cancelling unit comprises a piezo-electric device which outputs the sound wave that cancels the noise.

7. The MRI apparatus of claim 1, wherein the noise cancelling unit is connected to the controller by a wireless network, and is remote-controlled according to a control command of the controller.

8. A method of controlling a magnetic resonance imaging (MRI) apparatus, the method comprising:
   moving a noise cancelling unit, which is installed at a support panel on which a subject is placed, to be movable in a lengthwise direction of the support panel, to a target position; and
   outputting a sound wave that cancels noise which reaches the target position,
   wherein the outputting the sound wave that cancels the noise comprises outputting the sound wave based on pulse sequence information that drives a gradient coil.

9. The method of claim 8, wherein the outputting the sound wave that cancels the noise comprises outputting the sound wave based on characteristic of a reduction of the noise, which is generated outside of the noise cancelling unit and is reachable at the target position.

10. The method of claim 8, further comprising:
    detecting the noise, which is generated outside of the noise cancelling unit and reaches the target position.

11. The method of claim 10, wherein the outputting the sound wave that cancels the noise comprises outputting the sound wave based on an analysis result of a frequency, amplitude, and a phase of the detected noise.

12. The method of claim 11, wherein the detecting the noise comprises:
    detecting sound in a non-audible frequency band; and
    cancelling the outputting the sound wave that cancels the noise when the detected sound is in the non-audible frequency band.

13. The method of claim 8, further comprising moving the noise cancelling unit to an original position, which is a position designated in advance, when an MR imaging is completed.

14. A magnetic resonance imaging (MRI) apparatus comprising:
    a support panel on which a subject is placed in an imaging region;
    a controller configured to determine a target position of the support panel, based on a geometry of the subject;
    a noise cancelling unit comprising a body which is installed on the support panel to be movable in a longitudinal direction of the support panel to the target position and configured to output a sound wave that cancels noise that reaches the target position; and
    a gradient coil which forms magnetic field gradients in the imaging region according to a pulse sequence,
    wherein the noise cancelling unit is configured to receive pulse sequence information and form the sound wave that cancels the noise based on the pulse sequence information.

15. The MRI apparatus of claim 14, wherein the controller is further configured to determine a noise reduction factor, for various target positions along the support panel, and
    the noise cancelling unit is configured to output the sound wave that cancels the noise based on the noise reduction factor.

16. The MRI apparatus of claim 14, wherein the noise cancelling unit further comprises a detector configured to detect a frequency, amplitude, and a phase of the noise, and
    the noise cancelling unit is configured to output the sound wave that offsets the detected frequency, amplitude, and phase of the noise.

* * * * *